(12) United States Patent
Mosholder

(10) Patent No.: US 9,843,134 B1
(45) Date of Patent: Dec. 12, 2017

(54) TAMPER EVIDENT CABLE SEAL

(71) Applicant: The United States of America as represented by the Director, National Security Agency, Washington, DC (US)

(72) Inventor: Gary S. Mosholder, Sykesville, MD (US)

( * ) Notice: Subject to any disclaimer, the term of this patent is extended or adjusted under 35 U.S.C. 154(b) by 15 days.

(21) Appl. No.: 15/177,901

(22) Filed: Jun. 9, 2016

(51) Int. Cl.
| H01R 13/627 | (2006.01) |
| H01R 13/639 | (2006.01) |
| H01R 13/641 | (2006.01) |
| H05K 1/02 | (2006.01) |
| H05K 5/02 | (2006.01) |

(52) U.S. Cl.
CPC ......... *H01R 13/641* (2013.01); *H01R 13/627* (2013.01); *H01R 13/6397* (2013.01); *H05K 1/0275* (2013.01); *H05K 5/0208* (2013.01)

(58) Field of Classification Search
CPC ............ H01R 13/6272; H01R 13/6397; H01R 13/639; H01R 24/64; H05K 1/0275; H05K 5/0208; Y10S 439/917; G06F 21/70
See application file for complete search history.

(56) References Cited

U.S. PATENT DOCUMENTS

| 4,647,726 | A | * | 3/1987 | Blum | .............. | H01R 13/6395 |
| | | | | | | 24/115 A |
| 5,642,805 | A | | 7/1997 | Tefft | | |
| 6,796,152 | B1 | | 9/2004 | Yu | | |
| 6,802,723 | B2 | | 10/2004 | Decime et al. | | |
| 6,991,479 | B2 | | 1/2006 | Miao | | |
| 7,083,438 | B2 | | 8/2006 | Massaro et al. | | |
| 7,128,586 | B2 | | 10/2006 | Kung | | |
| 7,160,137 | B1 | | 1/2007 | Yeh | | |
| 7,223,574 | B2 | | 5/2007 | Lei et al. | | |
| 7,275,941 | B1 | | 10/2007 | Bushby | | |
| 7,390,201 | B1 | | 6/2008 | Quinby et al. | | |
| 7,428,834 | B1 | | 9/2008 | Lee | | |
| 7,462,045 | B1 | | 12/2008 | Lee | | |
| 7,479,021 | B2 | | 1/2009 | Huang | | |
| 7,530,824 | B2 | | 5/2009 | Bolain | | |
| 7,563,113 | B2 | | 7/2009 | Sheng | | |
| 7,581,417 | B1 | | 9/2009 | Chen | | |
| 7,635,272 | B2 | | 12/2009 | Poppe | | |
| 7,677,065 | B1 | | 3/2010 | Miao | | |
| 7,722,369 | B2 | | 5/2010 | Bushby | | |
| 7,794,245 | B2 | | 9/2010 | Thompson | | |
| 7,913,527 | B2 | | 3/2011 | Chen | | |
| 7,976,329 | B2 | * | 7/2011 | Foung | ................ | H01R 13/6272 |
| | | | | | | 439/344 |
| 8,029,299 | B1 | | 10/2011 | Huang | | |
| 8,142,212 | B2 | | 3/2012 | McSweeney et al. | | |
| 8,287,191 | B2 | * | 10/2012 | Nielson | .................. | G02B 6/406 |
| | | | | | | 385/69 |

(Continued)

*Primary Examiner* — James Harvey
*Assistant Examiner* — Oscar Jimenez

(57) ABSTRACT

A cable seal is provided for attachment to a cable connector. The cable seal generally includes a base portion and a breakaway portion. The breakaway includes a tooth which is positioned under the cable release lever to prevent removal of the cable connector from a communications port. If removal of the cable seal is desired, a breakaway portion of the cable seal is permanently detached from the remainder of the cable seal evidencing access to the port has been gained.

13 Claims, 8 Drawing Sheets

(56) References Cited

U.S. PATENT DOCUMENTS

| | | | |
|---|---|---|---|
| 8,348,686 B1* | 1/2013 | Huang | H01R 13/6272 |
| | | | 439/133 |
| 8,414,314 B1 | 4/2013 | Mosholder | |
| 8,449,309 B1 | 5/2013 | Mosholder | |
| 9,496,645 B2* | 11/2016 | Reed | H01R 13/6275 |
| 2003/0224637 A1 | 12/2003 | Ling | |
| 2003/0228777 A1 | 12/2003 | Lai | |
| 2005/0039502 A1 | 2/2005 | Avganim | |
| 2005/0164548 A1 | 7/2005 | Spears et al. | |
| 2005/0202698 A1 | 9/2005 | Miao | |
| 2006/0107073 A1 | 5/2006 | Lane et al. | |
| 2006/0134952 A1 | 6/2006 | Meister et al. | |
| 2006/0234533 A1 | 10/2006 | Lei et al. | |
| 2007/0037454 A1 | 2/2007 | Bushby | |
| 2007/0162655 A1 | 7/2007 | Huang | |
| 2007/0232142 A1* | 10/2007 | Desrochers | H01R 13/6395 |
| | | | 439/607.01 |
| 2008/0041125 A1 | 2/2008 | Poppe | |
| 2009/0007609 A1* | 1/2009 | Obenshain | H01R 13/6395 |
| | | | 70/158 |
| 2009/0042433 A1 | 2/2009 | Bushby | |
| 2009/0117763 A1 | 5/2009 | Chen | |
| 2010/0009565 A1 | 1/2010 | Wang | |
| 2010/0033913 A1 | 2/2010 | Cao | |
| 2012/0108088 A1 | 5/2012 | Peng et al. | |
| 2012/0289069 A1 | 11/2012 | Chueh et al. | |
| 2012/0330832 A1* | 12/2012 | Aidasani | G06Q 20/4012 |
| | | | 705/44 |
| 2014/0349506 A1* | 11/2014 | Lee | H01R 13/6275 |
| | | | 439/345 |

* cited by examiner

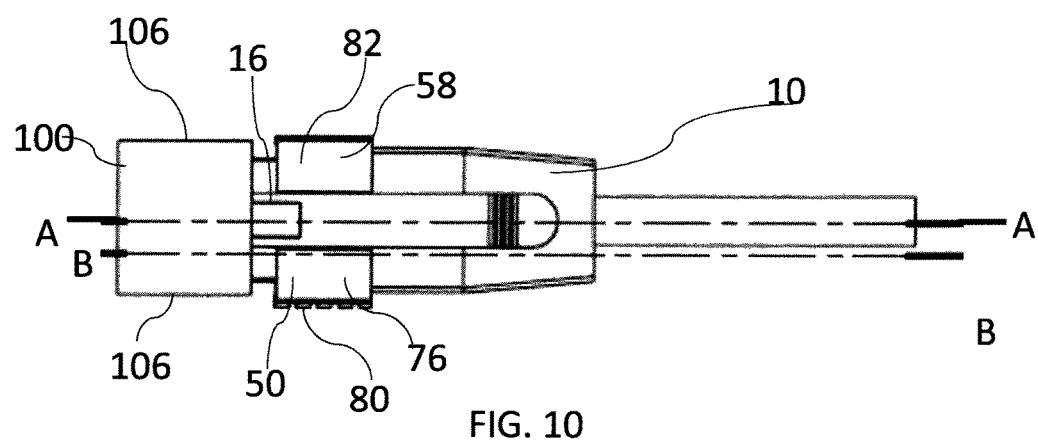
FIG. 10
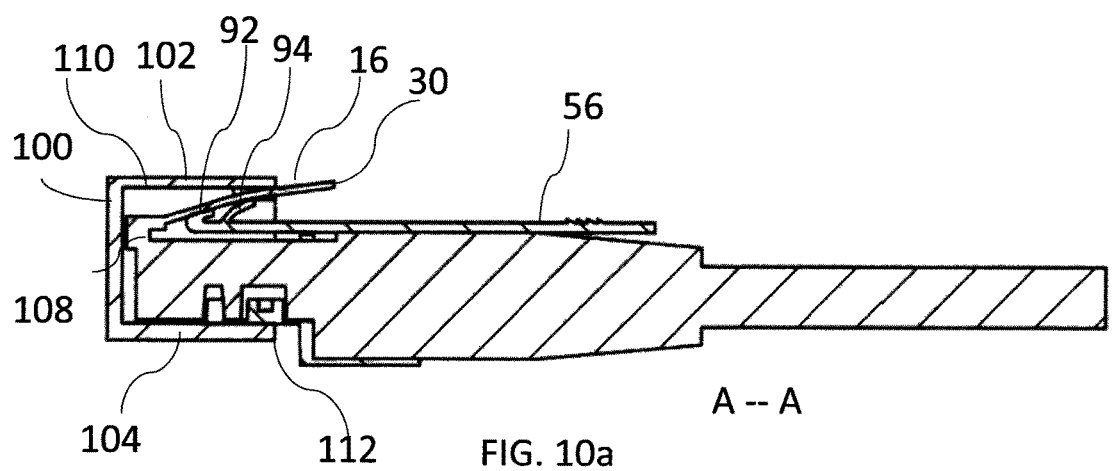
A -- A  FIG. 10a

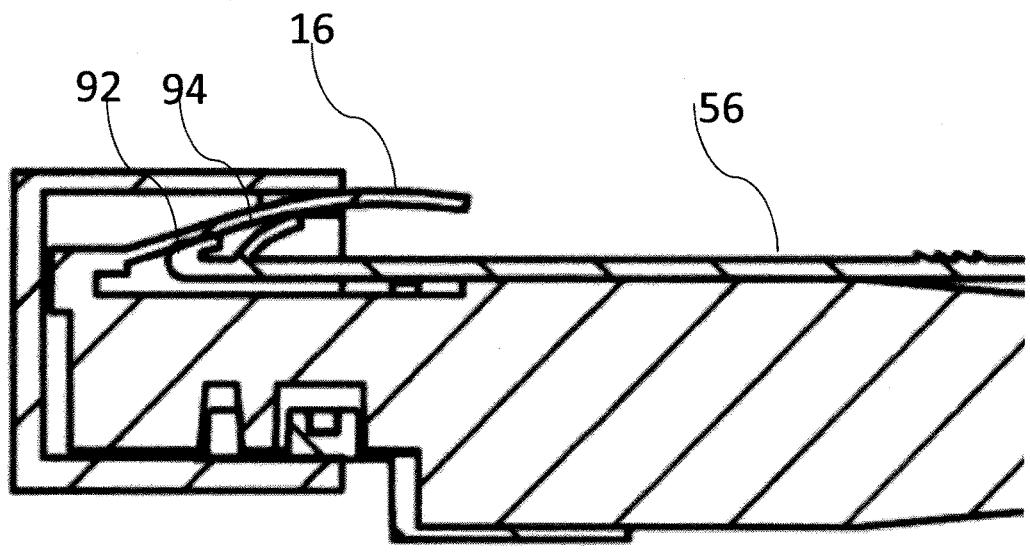
FIG. 11a  A -- A
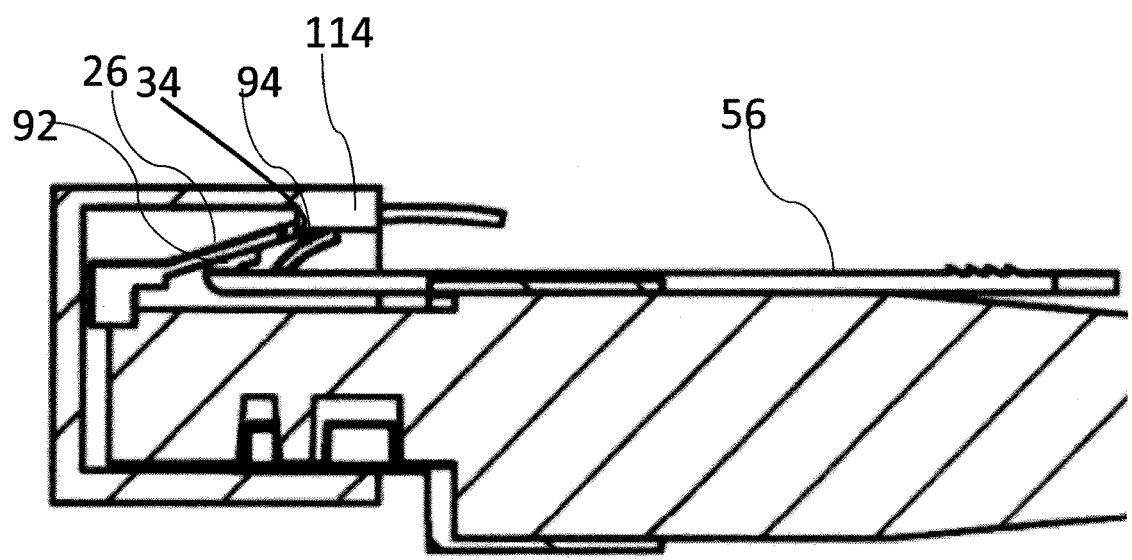
FIG. 11b  B -- B

TAMPER EVIDENT CABLE SEAL

FIELD OF THE INVENTION

This invention is generally directed to tamper evident cable seal.

BACKGROUND OF THE INVENTION

Communication ports such as, for example Ethernet ports together with cables including an RJ45 connector provide a convenient way for providing communication between devices (e.g. a computers, servers, etc.). These convenient interfaces, however, also provide an easy means for gaining unauthorized access to computers and other devices. A need exists for preventing unauthorized access to communication ports and/or for providing evidence when a port has been accessed.

SUMMARY OF THE INVENTION

Briefly, the present invention discloses a port protector in the form of a cable seal.

The cable seal includes a retaining member for engaging the connector and a tooth for preventing inadvertent or undetected removal of the connector from the port. A breakaway portion of the seal allows for removal of the connector from the port if desired, while providing evidence that the seal was broken and that access to the port has been achieved.

BRIEF DESCRIPTION OF THE DRAWINGS

The organization and manner of the structure and operation of the invention, together with objects and advantages thereof, may best be understood by reference to the following description, taken in connection with the accompanying drawings, wherein like reference numerals identify like elements in which:

FIG. 10 is a top view of the cable seal of FIG. 3 mounted to a cable connector and inserted within a port;

FIG. 10a is a cross-sectional view of the assembly of FIG. 10 taken along line A-A;

FIG. 11a is a cross-sectional view of a portion of the assembly of FIG. 10 taken along line A-A, with the lever illustrated in a flexed condition;

FIG. 11b is a cross-sectional view of a portion of the assembly of FIG. 10 taken along line B-B, with the lever illustrated in a flexed condition;

DETAILED DESCRIPTION OF THE PREFERRED EMBODIMENT

Figure 1:
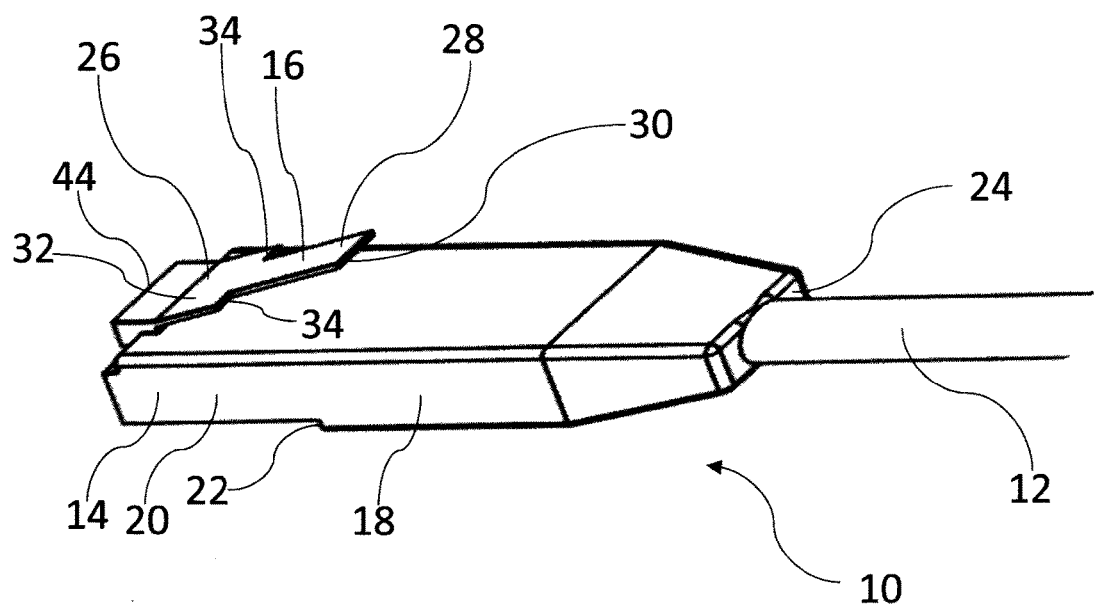
FIG. 1 is a top perspective view of a prior art cable and attached cable connector.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

The present invention provides a cable seal designed to be used in connection with a cable connector to be inserted in a communication port. The invention is intended for use in connection with, for example, an RJ45 type cable connector. Although the cable seal is illustrated in connection with an RJ45 type cable connector, it is to be understood, that the cable seal can be used in connection with connectors of various sizes and configurations. FIG. 1 illustrates an RJ45 type cable connector attached to a cable. The forward end of the cable connector includes points of contact which mate with points of contact provided in the communication port, such as for example an Ethernet port. The mated points of contact provide a communication path between, for example, a computer and a remote device attached to the cable.

It is noted that in describing the invention, the terms front, forward, rear, rearward, top, up, upper, bottom, down and lower will be used to describe position of elements relative to the communication port as illustrated in the drawings. For example, top and upper will be used to refer to elements near the top of the device as oriented in the drawings. Front and forward will be used to identify items positioned closer to the port and rear and rearward will be used to identify items positioned furthers from the port. It is to be understood that these terms are not intended to be limiting but rather are used to provide ease in describing the invention. For example, the port illustrated in FIG. 10 could be inverted such that the upper wall becomes a lower wall and the lower becomes an upper wall. A cable connector 10 for mounting in a port is illustrated in FIG. 1. The cable connector 10 encapsulates a free end of a cable 12 to provide efficient connection between the cable 12 and the port. The cable connector 10 generally includes a housing 14 and a release lever 16. The housing 14 generally provides a head portion 18 and a nose potion 20 of reduced outer dimension extending from the head portion 18. A bumper 22 is provided at the junction of the head portion 18 and the nose portion 20. A free end of a cable 12 is housed within the nose portion 20 of the housing 14 and the remainder of the cable extends rearwardly through the head portion and beyond the rear end 24 of the head portion 18.

The release lever 16 is provided at the forward end of the housing 14. The release lever 16 is generally T-shaped and includes an enlarged portion 26 secured to the front end of the housing and a rearwardly extending extension 28 providing a free end 30 of the release lever 16. Wings 32 are provided by the enlarged portion 26 of the release lever 16.

Outwardly extending locking edges 34 of the wings engage the port as will be described herein to retain the cable connector 10 within the port.

Figure 2:
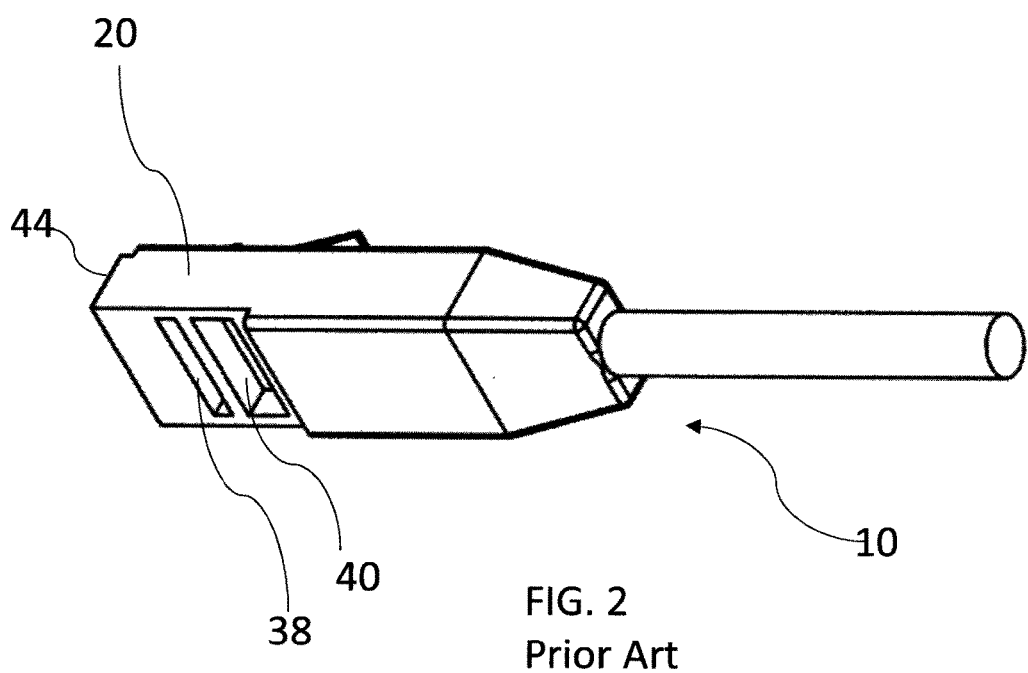
FIG. 2 is a bottom perspective view of a prior art cable and attached cable connector.

Terminal connections at the free end of the housing are located in the nose portion 20. As best illustrated in FIG. 2, a front cavity 38 and a rear cavity 40 are provided within the nose portion 20 of the housing.

To insert the cable connector 10 into the communication port, the connector 10 is moved forward within the port until the front end 44 of the connector 10 is positioned proximate an end wall of the port. When the connector 10 is in its forward most position, the locking edges 34 of the lever 16 are positioned forward of a port securing wall. As a result, if the cable connector 10 is pulled in the rearward direction, the wing edges 34 engage the port securing wall and the cable connector is prevented from exiting the port. Removal of the connector 10 from the port is accomplished by depressing the release lever 16 to clear the wing edges 34 from the port securing wall. With the wing edges 34 cleared of the port securing wall, the connector 10 can be slid rearwardly and removed from the port.

Figure 3:
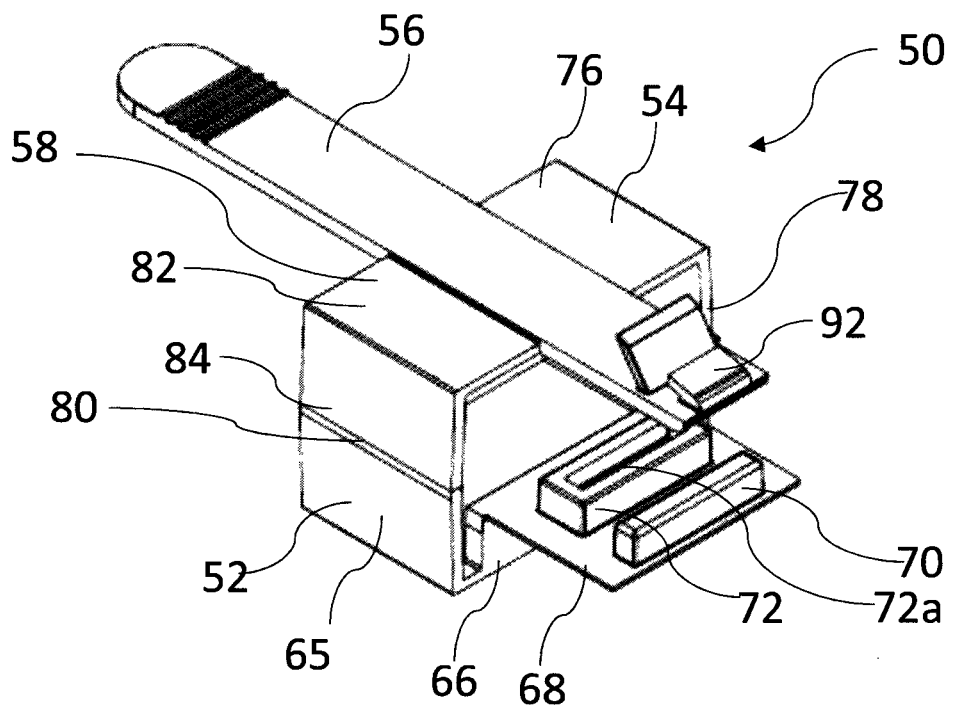
FIG. 3 is a top perspective view of an embodiment of a cable seal in a wrapped condition.
Figure 4:
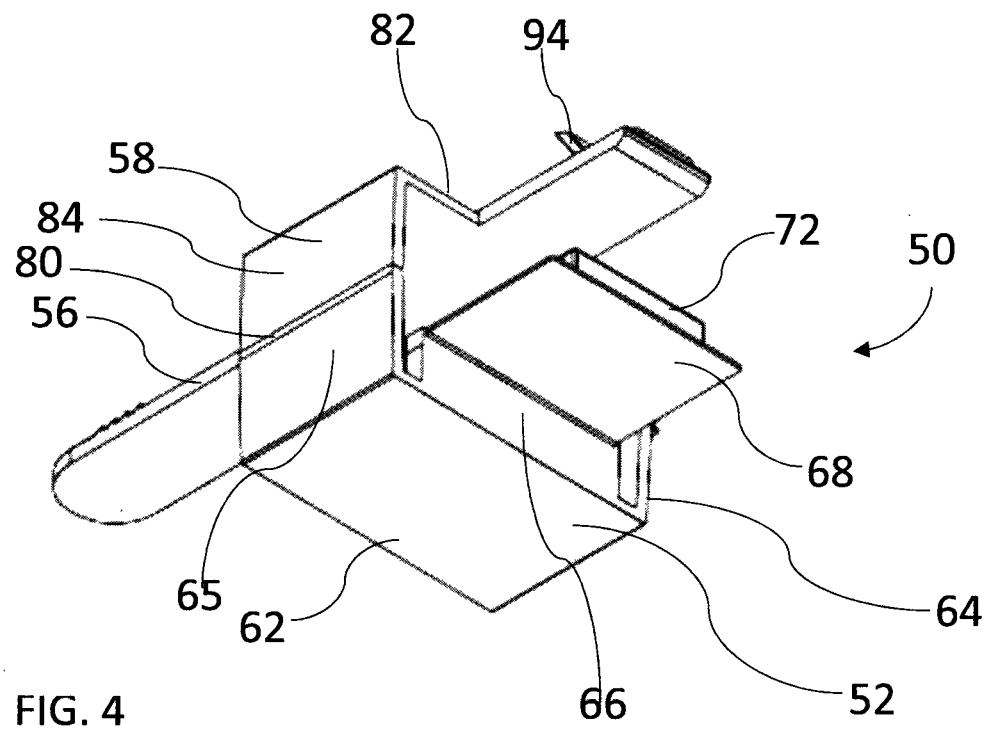
FIG. 4 is a bottom perspective view of the cable seal illustrated in FIG. 3.

An embodiment of the cable seal 50 of the present invention is illustrated in FIGS. 3-8. As will be described herein, the cable seal 50 includes a hinge 80 which allows the cable seal 50 to be positioned in a wrapped condition as illustrated in FIGS. 3 and 4 or in a flat/unwrapped condition as illustrated in FIGS. 5-8.

Figure 9:
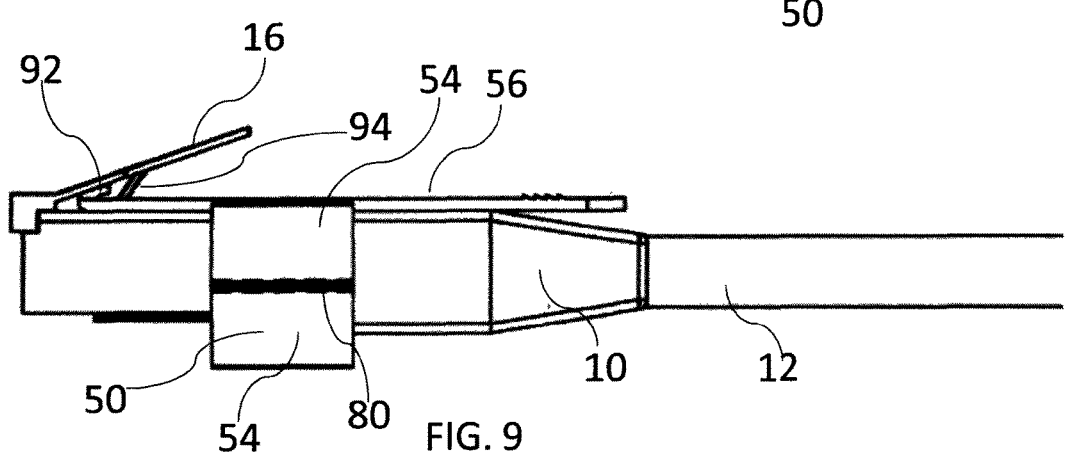
FIG. 9 is side view of the cable seal of FIG. 3 mounted to a cable connector and illustrated in a wrapped condition.

As illustrated in FIG. 3, the cable seal 50 generally includes a U-shaped lower base portion 52, an L-shaped upper base portion 54, a tongue 56, and an L-shaped wrapping portion 58. The tongue 56 and the L-shaped wrapping portion 58 together form a breakaway portion 60 as will be described more fully herein. When the cable seal 50 is in a wrapped condition, the lower base portion 52, the upper base portion 54 and the breakaway portion 60 together form a sleeve which is positioned around the cable connector as will be described herein and as illustrated in FIGS. 9 and 11.

As mentioned above and as best illustrated in FIGS. 4-6, the lower base portion 52 is generally U-shaped. The lower base portion 52 includes a center wall 62 and first and second depending side walls 64, 65 extending from opposite ends of the center wall 62. As best illustrated in FIG. 4, a riser 66 extends from a forward edge of the center wall 62 and a platform 68 extends from an upper end of the riser 66. The riser 66 is a retaining member as will be described herein. As best illustrated in FIG. 3, the platform 68 includes additional retaining members. More specifically the platform includes a front retaining block 70 and a rear retaining block 72. Each retaining block 70, 72 extends upwardly from the platform 68. The retaining block 72 includes a cavity 72a. Each side wall 64, 65 of the lower base portion 62 includes an upper end (See FIG. 6). An upper end 64a of the first sidewall 64 provides connection to the upper base portion 54 as will be described herein and the second upper end 65a is free.

Figure 5:
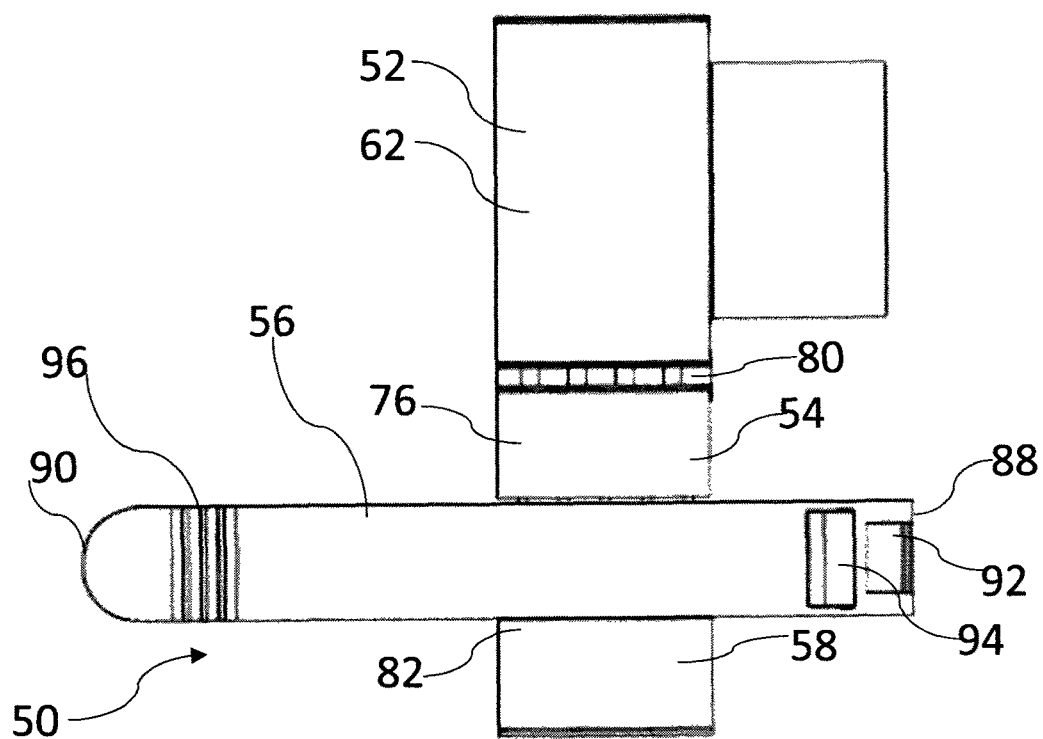
FIG. 5 is a top view of the cable seal of FIG. 3 in a flat or unwrapped condition.
Figure 6:
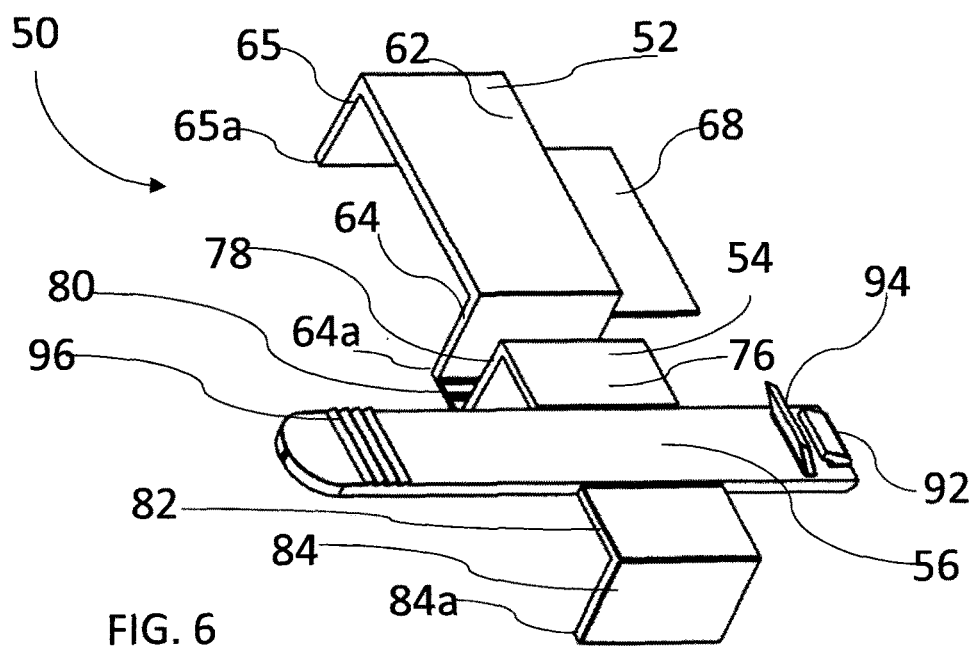
FIG. 6 is a top perspective view of the cable seal illustrated of FIG. 5.
Figure 8:
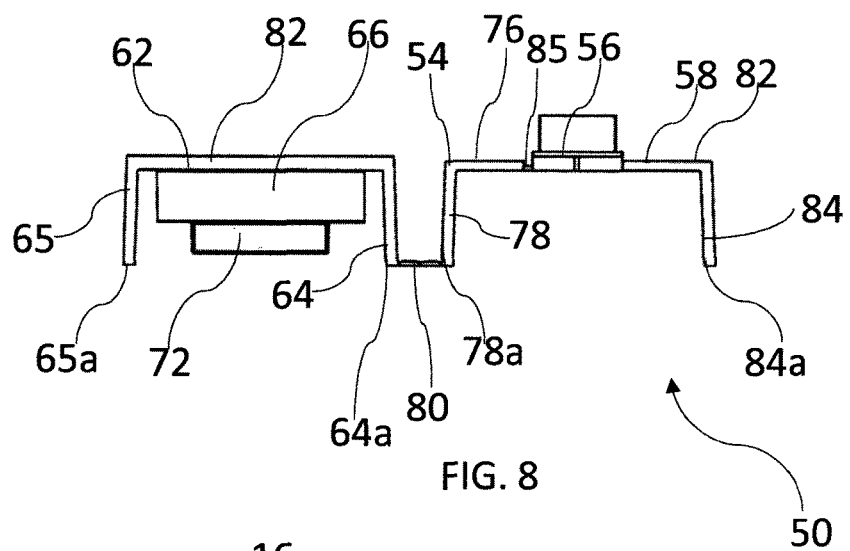
FIG. 8 is a rear view of the cable seal illustrated in FIG. 5.

As best illustrated in FIGS. 3, 6 and 8 the L-shaped upper base portion 54 includes an upper wall 76 and a depending side wall 78. As best illustrated in FIGS. 5 and 8, a lower end 78a of the side wall 78 of the upper base portion 54 is hingedly connected to the upper end 64a of the first side wall 64 of the lower base portion 52 via a hinge 80.

The L-shaped wrapping portion 58 includes an upper wall 82 and a depending side wall 84. The depending sidewall 84 provides a free end 84a of the L-shaped wrapping portion 58. When the cable seal is placed in the wrapped condition, the free end 84a of the L-shaped wrapping portion 58 abuts the free end 65a of the second side wall 65 of the lower base portion 52.

Figure 7:
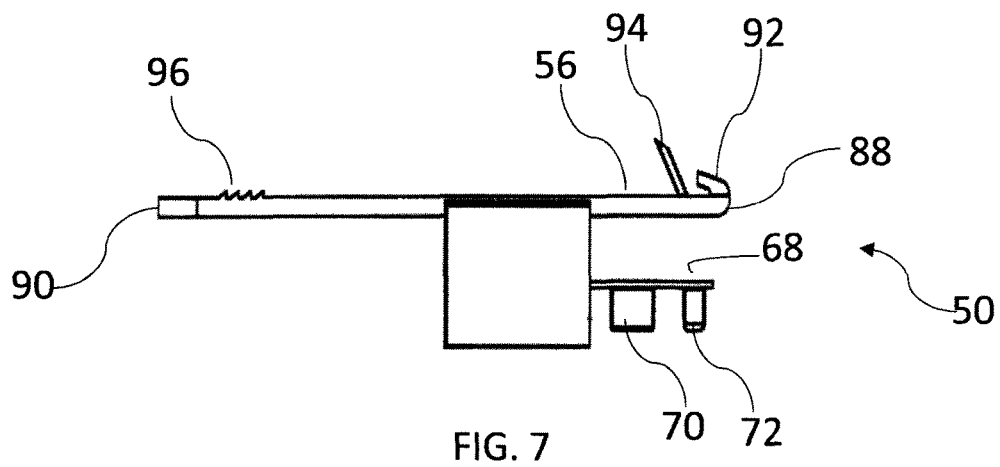
FIG. 7 is a side view of the cable seal illustrated in FIG. 5.

As best illustrated in FIGS. 5, 6 and 8, the tongue 56 is positioned between and fixed to the upper wall 76 of the upper base portion 54 and the upper wall 82 of the wrapping portion 58 and fixed to the upper walls 76 and 82. The connection between the upper wall 76 of the upper base portion 54 and the tongue 56 is however perforated to provide a detachable connection 85 between the upper wall 76 of the upper base portion 54 and the tongue 56. As best illustrated in FIG. 7, the tongue 56 provides a front end 88 which extends forward of the front edges of the upper walls 76, 82 and a rear end 90 which extends rearward of the rear edges of the upper walls 76, 82. Proximate the front end 88, the tongue 56 includes a tooth 92 which generally extends upwardly and rearwardly from the front end 88 of the tongue 56. The angle at which the tongue 56 extends is selected based upon the angle of the release lever of the connector to be wrapped. As will be described herein, the tooth 92 inhibits depression of the release lever 16 of the connector 10. The tongue 56 further includes a tooth barrier 94 positioned rearward of the tooth 92. The barrier 94 also extends upwardly and rearwardly from the front end 88 of the tongue 56. As will be described herein, the tooth barrier 94 prevents access to the tooth 92. Gripping members 96 are provided proximate the rear end 90 of the tongue 76.

As noted above, the lower and upper base portions 52, 54 are connected via the hinge 80. FIGS. 9-11 illustrate the cable seal 50 mounted to an RJ45 connector 10. To mount the cable seal 50 to the connector 10, the lower base portion 52 is rotated relative to the upper base portion 54 to position the seal 50 in a flat position. Next the tooth 92 and the tooth barrier 94 of the tongue 56 are positioned under the connector release lever 16 generally aligning the tongue 56 over the cable 12. More specifically the tooth 92 of the tongue 56 is positioned under the enlarged portion 26 of the release lever 16. The upper wall 76 of the upper base portion 54, the tongue 56 and the upper wall 82 of the wrapping portion 58 generally rest on the upper surface of the cable connector 10. The side wall 78 of the upper base portion 54 and the side wall 84 of the wrapping portion 58 are position along opposite sides of the head portion 18 of the cable connector 10. Next, the lower base portion 52 is rotated about the hinge 80 relative to the upper base portion 54 until the center wall 62 of the lower base portion 52 contacts a lower surface of the connector housing 10. As illustrated in FIG. 9, upon contacting the connector 10 with the center wall 62 of the lower base portion 52, the front and rear retaining blocks 70, 72 of the cable seal 50 will be positioned within the front and rear cavities 38, 40 of the connector 10; the riser 66 of the lower base portion 52 will abut the bumper 22 of the connector 10; and the free end 65a of the second side wall 65 of the lower base portion 52 abuts the free end 84a of the side wall 84 of the wrapping portion 58. As illustrated in FIG. 9, in this wrapped position, the cable seal 50 forms a sleeve around a portion of the connector 10.

Figure 10B:
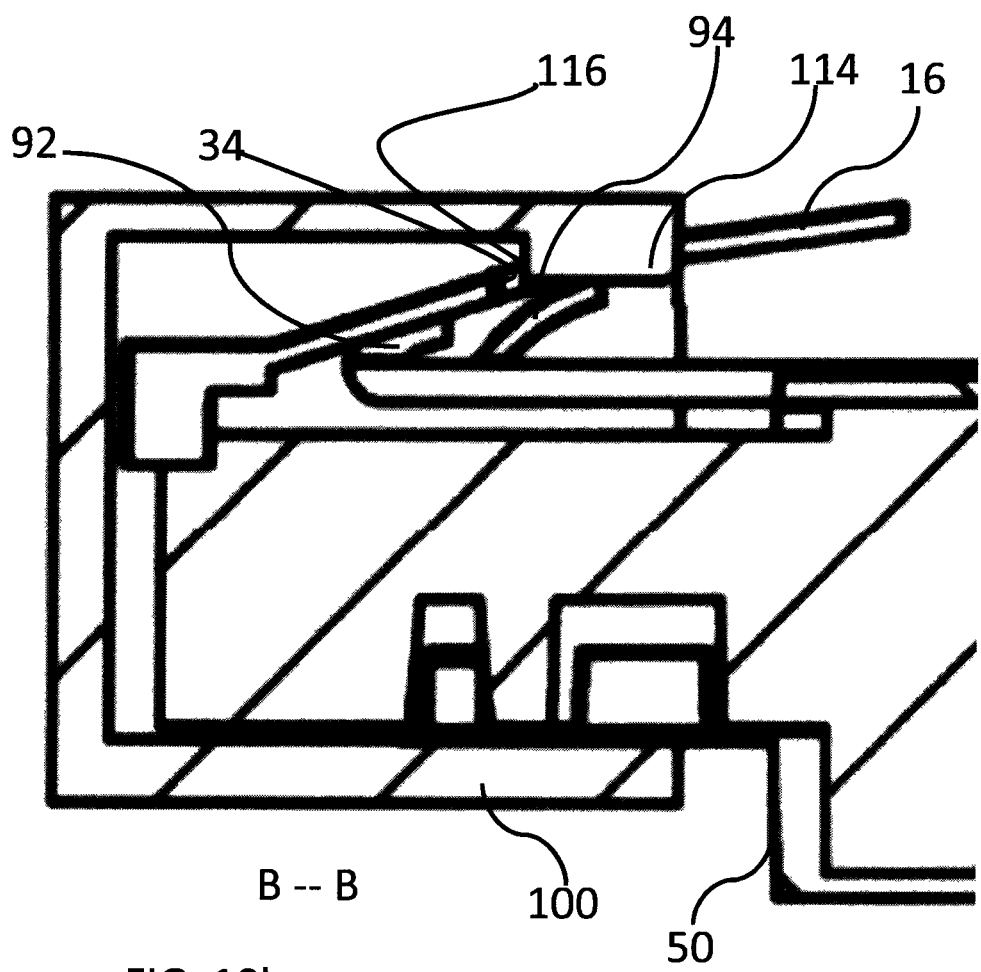
FIG. 10b is a cross-sectional view of a portion of the assembly of FIG. 10 taken along line B-B.

Once the cable seal 50 is wrapped around the connector 10, the connector 10 is ready for insertion into the port 100. FIG. 10 illustrates a port 100 with a cable connector 10 wrapped in a cable seal 50 and inserted within the port 100. The port 100 generally includes an upper wall 102, a lower wall 104 opposite the upper wall, opposite side walls 106, and an end wall 108 extending between forward edges of the lower, upper and side walls to form a port cavity 110. Free ends of the upper, lower and sidewalls form a rear end 112 of the port 100. As best illustrated in FIG. 10b port securing notches 114 extend downwardly from the upper port wall 102 proximate the side walls 106 providing a channel through which a portion of the cable connector release lever 16 extends. Forward surfaces 116 of the port securing notches 114 provide port securing surfaces on either side of the channel. One such port securing surface 116 is illustrated in FIG. 10b.

FIGS. 10, 10a and 10b illustrate the secure position of the cable connector 10 and the wrapped cable seal 50 in the port 100. As the connector 10 and seal 50 are moved forward into the port 100, the lever 16 contacts the upper wall 102 of the port 100, causing the lever 16 to flex downwardly. In addition, the lever wings 32 of the lever 16 will contact a lower surface of the port securing notches 114 of the port 100 causing the wings 32 to flex downwardly. Once the locking edges 34 of the wings 32 have moved to a position forward of the port securing surfaces 116 of the port securing notches 114, the wings 32 of the lever 16 spring upwardly and the locking edges 34 of the wings 32 are positioned forward of the locking surfaces 116 of the port securing notches 114 as illustrated in FIG. 10b, preventing the cable connector 10 and wrapped cable seal 50 from removal of the connector 10 and seal 50 in the rearward direction.

Engagement between the forward portion of the cable seal 50 and the walls of the port 100 assist in maintaining the cable seal 50 in the wrapped position. In addition, engagement between the retaining blocks 70, 72 of the seal 50 and the cavities 38, 40 of the connector 10 and engagement between the riser 66 of the seal 50 and the bumper 22 of the connector 10 prevent the seal 50 from being slid rearwardly relative to the connector 10 to retain the cable seal 50 in position relative to the connector 10.

As illustrated in FIGS. 9-10, and as noted above, the tooth 92 of the tongue 56 is positioned under the enlarged portion 26 of the connector release lever 16. The barrier 94 is positioned under the extension 28 of the lever 16. In the event the free end of the lever 16 is depressed as illustrated in FIGS. 11a and 11b, the outer end of the lever 16 flexes downward however, a forward portion of the lever 16 is prevented from flexing downward due to the engagement between the lever 16 and the tooth 92. Thus, despite the downward movement of the free end 30 of the lever 16, the enlarged portion 26 of the lever 16 is prevented from moving downwardly. Specifically, the locking edges 34 of the wings 32 are not able to clear the port securing notches 114. In addition, the tooth barrier 94 prevents access to the tooth 92 thereby providing a deterrence against attempts to compress or perhaps remove the tooth 92. If desired, the barrier 94 may also be constructed so as to aid in preventing downward movement of the wings 32 of the lever 16.

Figure 12:
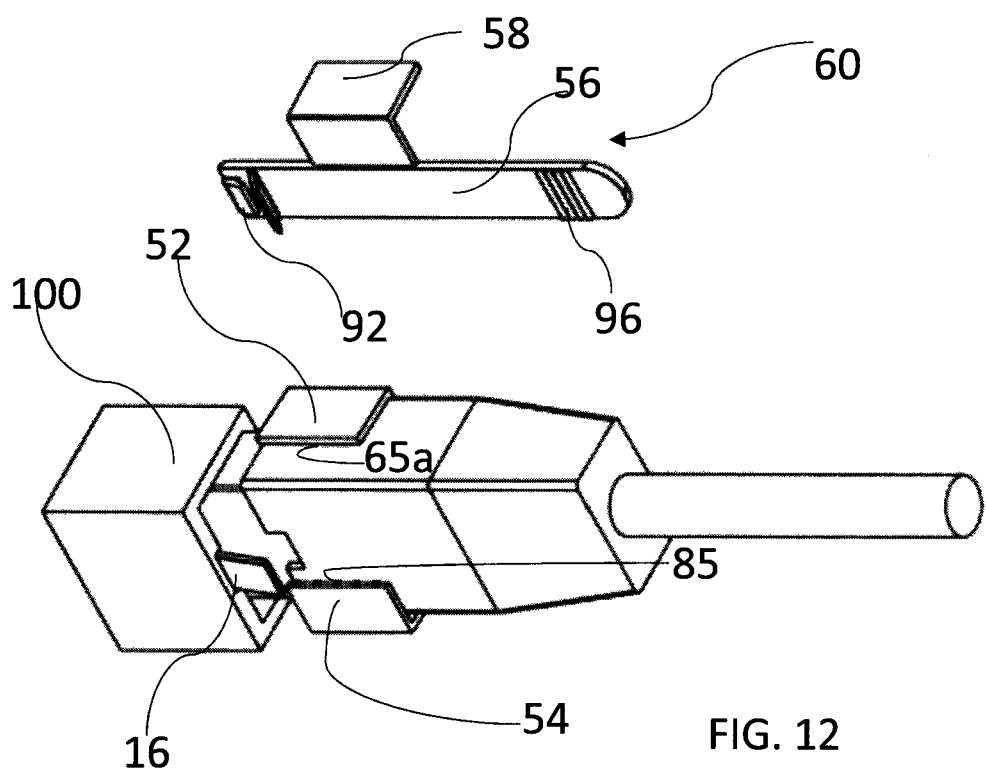
FIG. 12 is a perspective view of the assembly of FIG. 10, with the break-away portion removed.
Figure 13:
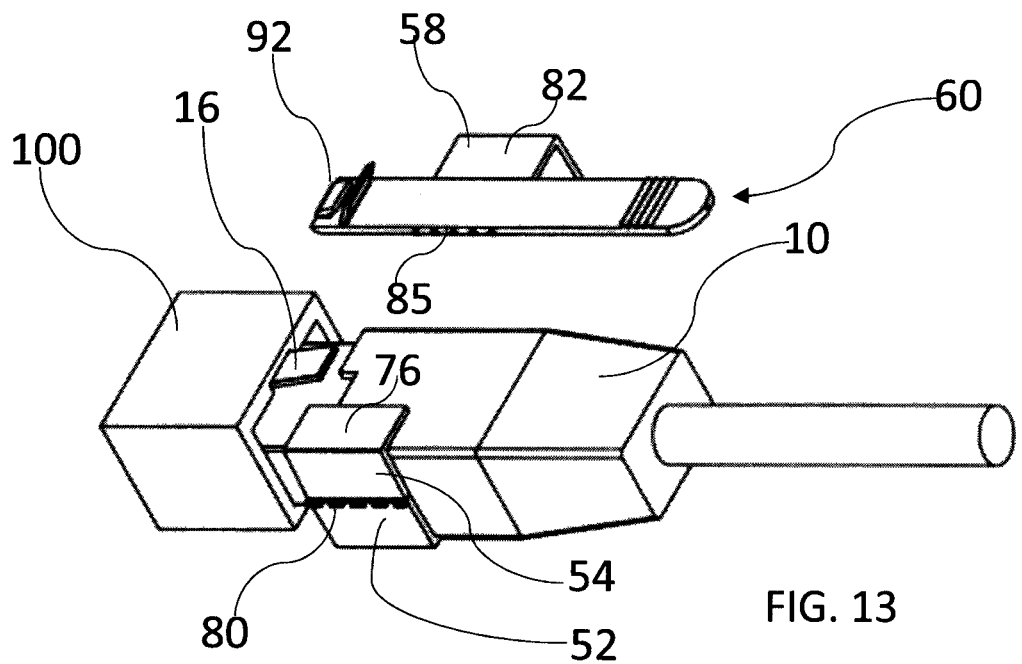
FIG. 13 is perspective view of the assembly of FIG. 10 with the break-away portion is removed.

If removal of the connector 10, associated cable 12 and the cable seal 50 from the port 100 is desired, the gripping portion 96 of the tongue 56 is grasped and the tongue 56 of the cable seal 50 is pulled rearwardly. When sufficient force is applied, the tongue 56 along with the attached wrapping portion 58 will break away from the upper base portion 54 at the perforation 85 as illustrated in FIGS. 12 and 13. As noted above, the tongue 56 and wrapping portion 58 together provide a breakaway portion 60. With the breakaway portion 60 removed, the tooth 92 and barrier 94 are no longer positioned under the connector release lever 16 and the connector release lever 16 may be depressed. Sufficient depression of the release lever 16 is permitted allowing the lever wings 32 to clear the port securing notches 114. As a result, the connector 10 will slide rearwardly relative to the port 100. Because the breakaway portion 60 will be permanently detached from the remainder of the seal 50, the broken seal provides evidence that access to the port has been gained. If desired, a serial number or other unique marking, can be provided on the cable seal 50 to ensure that if the cable seal 50 is replaced with a new cable seal 50, replacement of the cable seal 50 is evident.

It is noted that a benefit provided by the current invention is that it may be utilized in connection with standard connectors; i.e. no adaption of the standard connector is required in order to utilize the cable seal 50.

While a preferred embodiment of the present invention is shown and described, it is envisioned that those skilled in the art may devise various modifications of the present invention without departing from the spirit and scope of the appended claims. For example, the cable seal 50 has been described as including a front and rear retaining block 70, 72, and a riser 66 to retain the cable seal 50 on the cable connector 10. It is to be understood that the cable seal could be formed with only one of these retaining elements.

The invention claimed is:

1. A cable seal for sealing a cable connector inserted into a communications port said cable seal comprising:
   a base, said base including a retaining member for engagement with an outer surface of the cable connector;
   a breakaway portion detachably connected to said base, said breakaway portion including a tooth to prevent depression of a cable connector release lever; and
   wherein upon detachment of said breakaway portion from said base, said detachment is permanent.

2. The cable seal of claim 1, wherein said base is provided by an upper portion and a lower portion and said upper and lower portions are hingedly attached.

3. The cable seal of claim 1, wherein said retaining member is a retaining block.

4. The cable seal of claim 3, wherein said retaining block is positioned within a cavity defined by an outer surface of the cable connector when the cable seal is mounted to the cable connector.

5. The cable seal of claim 1, wherein said retaining member is a riser.

6. The cable seal of claim 5, wherein said riser abuts a bumper defined by the outer surface of the cable connector when said seal is mounted to the cable connector.

7. The cable seal of claim 1, wherein said breakaway portion includes a tongue.

8. The cable seal of claim 7, wherein said tongue further includes a gripping member.

9. The cable seal of claim 1, wherein said breakaway portion is connected to said base via a perforated connection.

10. The cable seal of claim 1, wherein said breakaway portion further includes a tooth barrier.

11. The cable seal of claim 10, wherein when said cable seal is in a mounted state and positioned within a communications port, said tooth barrier is positioned within said communications port.

12. The cable seal of claim 1, wherein said cable seal includes a unique marking.

13. The cable seal of claim 1, wherein when said cable seal is in a mounted state and positioned within a communications port, said tooth is positioned within said communications port.

* * * * *